(12) United States Patent
Cohen (10) Patent No.: US 7,476,573 B2
(45) Date of Patent: Jan. 13, 2009

(54) METHODS OF SELECTIVE DEPOSITION OF FINE PARTICLES ONTO SELECTED REGIONS OF A SUBSTRATE

(75) Inventor: Guy Moshe Cohen, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 307 days.

(21) Appl. No.: 11/135,126

(22) Filed: May 23, 2005

(65) Prior Publication Data

US 2006/0264039 A1 Nov. 23, 2006

(51) Int. Cl.
*H01L 21/84* (2006.01)
(52) U.S. Cl. .................. 438/149; 438/155; 257/E21.32
(58) Field of Classification Search .............. 438/149, 438/155, 947; 257/E21.32
See application file for complete search history.

(56) References Cited

U.S. PATENT DOCUMENTS 6,310,362 B1* 10/2001 Takemura .................... 257/59
2002/0123227 A1* 9/2002 Winningham et al. ....... 438/700

\* cited by examiner

*Primary Examiner*—Thanh Nguyen
(74) *Attorney, Agent, or Firm*—Scully, Scott, Murphy & Presser, P.C.; Ido Tuchman (57) ABSTRACT

A method for depositing fine particles from a suspension on selected regions of a substrate is disclosed. The particles are deposited on selected regions of a clean hydrophobic semiconductor surface that are surrounded by a wetting boundary which includes a mesa formed by etching through a silicon-on-insulator (SOI) film and an underlying buried oxide of an SOI substrate. The process is well suited for the growth of semiconductor nanowires that nucleates from fine particle used as a catalyst.

9 Claims, 7 Drawing Sheets

DEPOSITED AU PARTICLES ON SOI ISLAND

FIG. 8B

DEPOSITED AU PARTICLES ON SOI ISLAND
SILICON SUBSTRATE SURFACE

AU PARTICLES

SILICON SUBSTRATE SURFACE   BURIED OXIDE   SOI FILM

METHODS OF SELECTIVE DEPOSITION OF FINE PARTICLES ONTO SELECTED REGIONS OF A SUBSTRATE

FIELD OF THE INVENTION

The present invention relates to a method of selective deposition of fine particles onto selected regions of a wafer. In particular, the present invention provides a method in which the particles are deposited from a suspension, which is uniformly applied onto the wafer surface, and populates predefined regions on the wafer.

BACKGROUND OF THE INVENTION

In nanotechnology, metal particles are typically used as catalysts for growth of nanowires and nanotubes (hereinafter nanomaterials). Each metal particle nucleates a single nanomaterial. As a result, the base location of each nanomaterial corresponds to the location held by the particulate catalyst from which it is nucleated. Accurate positioning of the metal catalyst provides a way to control the location of the nanomaterials. The diameter of the metal catalyst particle also defines the diameter of the nanomaterial. To obtain a tight distribution of nanomaterial diameters, metal colloids are typically used as the source of the metal particles. As is known to those skilled in the art, metal colloids have a tight size distribution of suspended particles made to a specified dimension. The fine particles are suspended in a liquid, and are typically charged to prevent them from forming clusters. Therefore, a method that provides an easy and robust way to deposit catalyst particles from a suspension onto selected regions of a wafer is desirable as a way to control both the nanomaterial location and diameter.

Figure 1A:
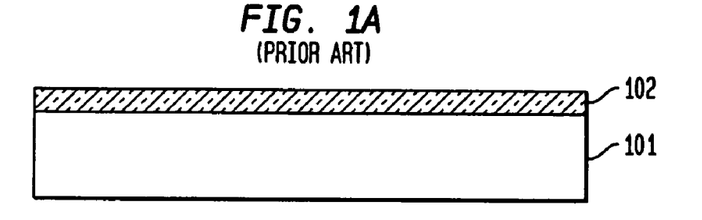
FIGS. 1A-1E are pictorial representations (through cross sectional views) illustrating the basic processing steps of a prior art technique that uses photolithography and masked etching to fabricate a substrate with particles at selected (masked) regions.
Figure 1B:
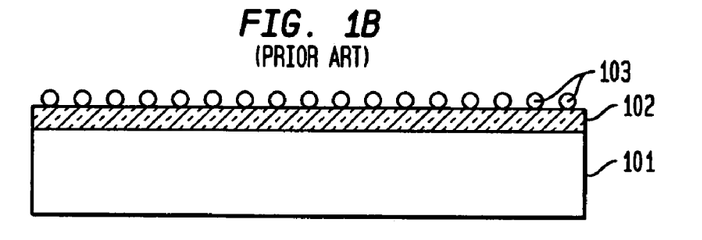
Figure 1C:
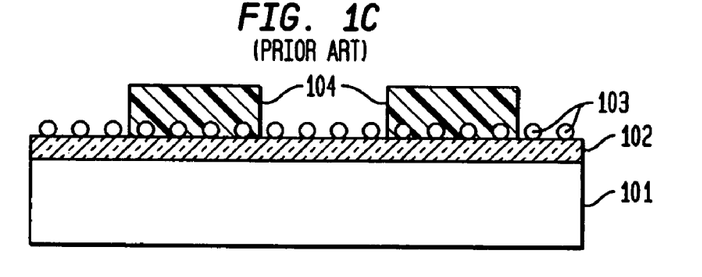
Figure 1D:
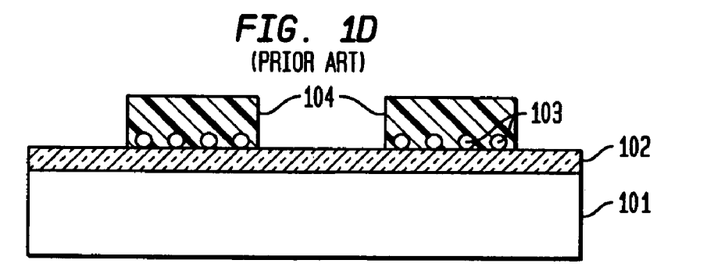
Figure 1E:
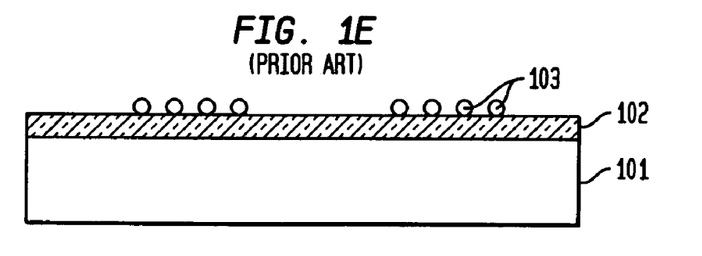

Conventional methods for obtaining metal particles at selected regions include, for example, blanket deposition of the particles followed by masking of a selected region and removal of the unmasked particles (for example, by etching). An example of such a method is illustrated in prior art FIGS. 1A-1E. The starting substrate 101 consists of a silicon substrate on which a thermal silicon dioxide ($SiO_2$) layer 102 is formed (See, FIG. 1A). Particles 103 are dispensed on the $SiO_2$ layer 102 providing the structure shown, for example, in FIG. 1B. The particles 103 can be dispensed by methods such as spraying, or by spinning a suspension. A photoresist film 104 is spun over the wafer and patterned by lithography to mask those regions where particles 103 are to remain providing the structure shown in FIG. 1C. Unprotected particles 103, as shown in FIG. 1D, are then removed by etching. Finally the photoresist 104 is removed by a solvent or by exposure to oxygen plasma. The resultant structure including the particles 103 on selected regions of the structure is shown in FIG. 1E.

The conventional methods, as illustrated by FIGS. 1A-1E, introduce some issues. First, for growth of nanowires it is imperative that the particles will be deposited directly on a clean silicon surface. The removal of the silicon native oxide is typically carried out by etching in diluted hydrofluoric acid (HF) that hydrogen terminates the surface and renders it hydrophobic (repelling water). Many suspensions consist of an aqueous solution in which the particles are suspended. Due to the hydrophobic nature of the silicon surface, the suspension will not wet the surface and, as a result, the particles will wash away. That is why in the example shown in FIGS. 1A-1E the substrate surface consists of a $SiO_2$ film 102 that is hydrophilic and thus it is easily wetted by the suspension. Second, the use of a mask (for protecting the particles) will, in many instances, introduce additional issues. For example and in the case of a photoresist mask, the stripping of the resist with a solvent can wash or relocate the particles, while stripping by oxygen plasma will oxidize the silicon surface. Additionally, the use of a photoresist can introduce contamination by organic products.

Given the above challenges with the prior art a method that will allow the deposition of fine particles from a suspension directly onto designated regions of a clean hydrogen terminated silicon surface is desirable. The term "fine particles" is used throughout the instant application to denote particles having a typical size of about 1 to about 100 nm.

SUMMARY OF THE INVENTION

The present invention provides a method for selectively depositing fine particles from a suspension on previously defined regions. The present invention also enables the deposition of the particles from an aqueous solution directly on a hydrogen terminated silicon surface.

In particular, the present invention uses the wetting properties of a surface and the surface tension thereof to provide deposition selectivity and to allow deposition over surfaces that otherwise cannot be wet by aqueous colloids.

In a first aspect of the invention, a method for depositing fine particles suspended in an aqueous solution over selected surfaces of hydrophobic silicon is disclosed. The selected regions are first enclosed by a wetting boundary. The silicon surface is then rendered hydrophobic by a diluted HF dip. The suspension is dispensed on the surface, and spinning is used to dry the liquid. The aqueous suspension rolls-off from all the hydrophobic surfaces except those that are enclosed by the wetting boundary. As a result, particles deposit only on regions enclosed by the wetting boundary.

In one embodiment, the enclosed silicon regions consist of silicon-on-insulator (SOI) mesas that are defined by etching through the buried oxide (BOX). The sidewalls of each SOI mesa consist of a buried oxide portion that serves as the wetting boundary. Within this embodiment of the present invention, the enclosed silicon regions consist of etched silicon mesas surrounded by a $SiO_2$ sidewall spacer. After etching of the silicon mesa, a layer of $SiO_2$ is blanket deposited and etched to form a $SiO_2$ sidewall spacer, which serves as the wetting boundary.

In some embodiments of the present invention, additional selectivity is obtained within the wetted regions when charged particles are used. As an example, negatively charged particles will be repelled from a $SiO_2$ surface even though it is wetted by the aqueous solution.

In yet other embodiments of the present invention, semiconductor nanowires are grown from catalysts that were deposited using the inventive technique. The nanowires growth is carried out by a method such as chemical vapor deposition (CVD). Since the catalyst particles are deposited directly on a clean silicon surface (i.e., no oxide interface between the catalyst and the silicon surface), the nanowire orientation can be well controlled.

DETAILED DESCRIPTION OF THE INVENTION

The present invention, which provides a method for selectively depositing fine particles from a suspension on defined regions, including hydrogen terminated silicon surfaces, will now be described in greater detail by referring to the following discussion. In this discussion, reference will be made to various drawings that illustrate embodiments of the present invention. Since the drawings of the embodiments of the present invention are provided for illustrative purposes, the structures contained therein are not drawn to scale.

Figure 2:
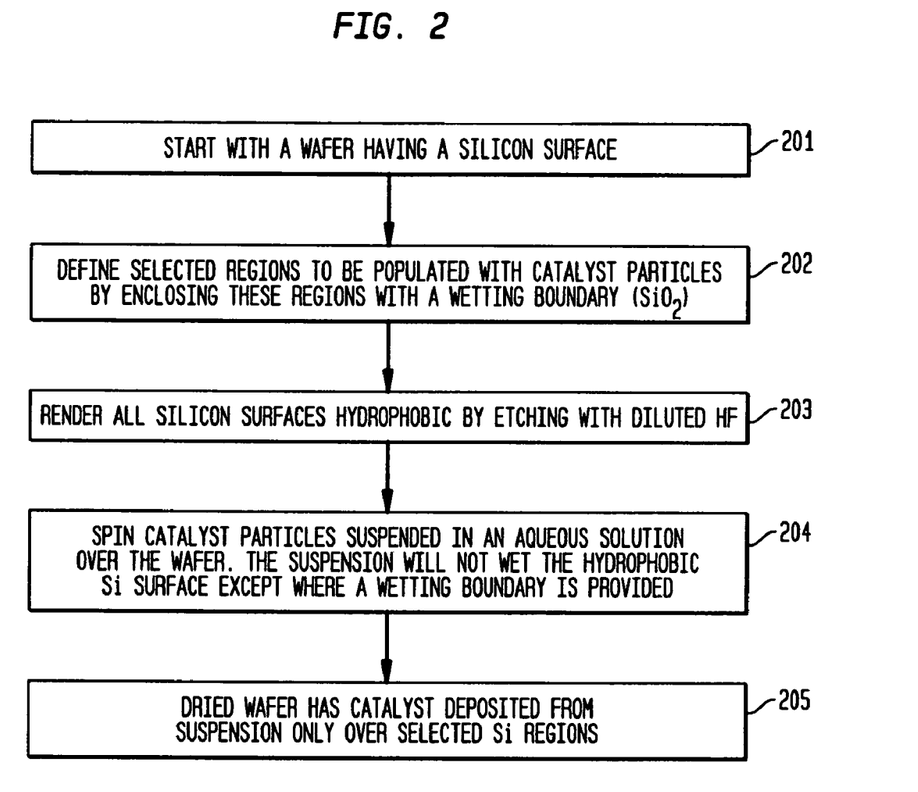
FIG. 2 is a flow chart describing the main processing steps used in the present invention for fabricating a substrate with a catalyst deposited from a suspension over selected silicon regions.

The basic technique is described in the flow chart FIG. 2, with the more specific methods of forming the wetting boundary described in FIGS. 3 to 5. Referring to FIG. 3A, a starting substrate 300 such as a silicon-on-insulator (SOI) wafer is used. The starting substrate 300 comprises a silicon substrate 301, a buried oxide 302, and a SOI film 303 formed over the buried oxide 302. The starting substrate 300 is fabricated by a method such as Separation by IMplanted OXygen (SIMOX), or wafer bonding and layer transfer. If wafer bonding is used, then layer 302 may be other than silicon dioxide. Layer 302 should have the property of being hydrophilic. This step is represented by reference numeral 201 of FIG. 2.

Figure 3A:
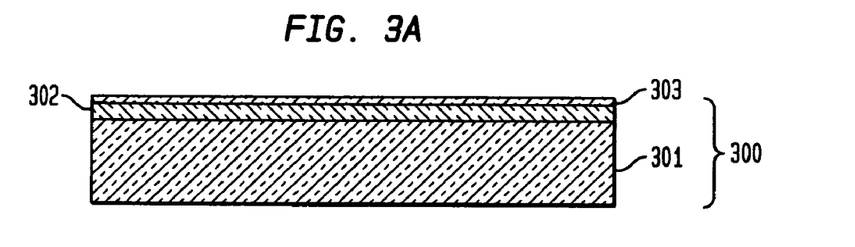
FIGS. 3A-3D are pictorial representations (through cross sectional views) illustrating the basic processing steps used in the present invention when the wetting boundary is a buried oxide sidewall of a silicon-on-insulator substrate mesa.
Figure 3B:
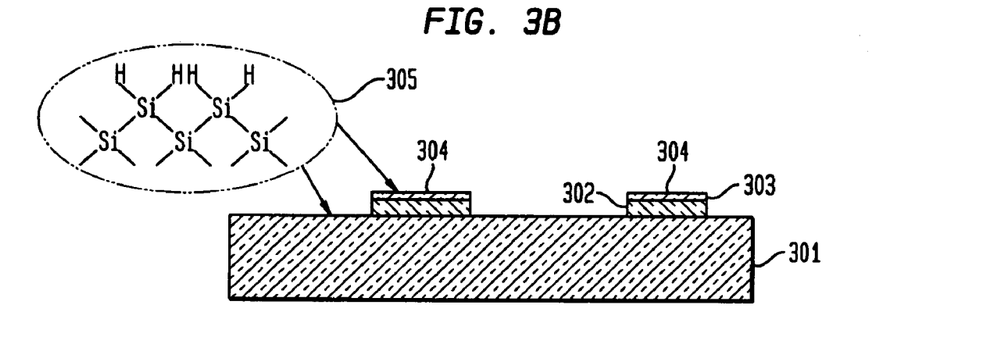

Referring to FIG. 3B, the SOI film 303 and the buried oxide film 302 are patterned so that SOI mesas are formed. This step is also defined in FIG. 2 by reference numeral 202. The patterning of the film can be done by conventional lithography and reactive ion etching (RIE). The etch process cuts through the buried oxide layer and stops on the silicon substrate 301 surface. The resulting mesa consists of SOI islands 304 with the bottom portion of the mesa sidewall being the buried oxide 302. The $SiO_2$ sidewall provides a wetting boundary for the SOI island 304.

Next, and as defined in FIG. 2 by reference numeral 203, the substrate 301 is dipped in diluted hydrofluoric acid (DHF) to remove the native oxide and to terminate the silicon surface with hydrogen 305. As a result, the silicon surface turns hydrophobic and will not wet by aqueous solution.

Figure 3C:
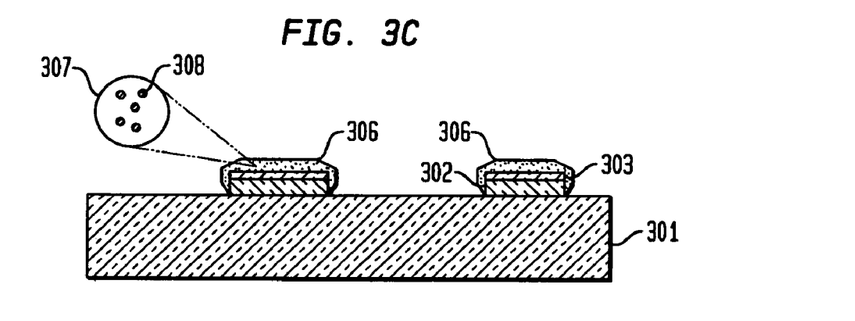

Referring to FIG. 3C and as defined in FIG. 2 by reference numeral 204, a suspension of fine particles 308 in an aqueous solution 307 (for example, a gold colloid) is dispensed on the substrate surface. Other particles besides gold, such as Ag, Pt, Fe, Co, Pd, iron-oxide, and other metals or metal oxides are also contemplated herein. Spinning of the wafer is used to remove excess liquid from the substrate surface. Since the silicon surface was previously rendered hydrophobic, the aqueous solution 307 will not wet the surface and will roll off from the surface of the substrate. However, regions surrounded by a wetting boundary 302 will be covered by the suspension liquid 306 regardless of the SOI 303 surface being hydrophobic. It is observed that the topography alone will not provide such wetting. For example, a mesa with sidewalls consisting of silicon only (i.e., no $SiO_2$ wetting boundary) will not support a suspension liquid 306 coverage and will remain dry.

Figure 3D:
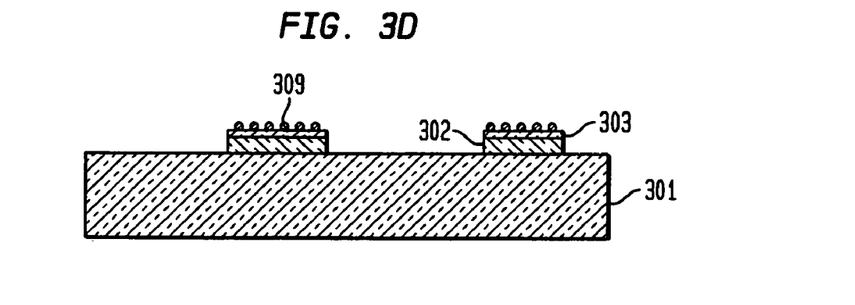

Referring to FIG. 3D, the fine particles 308 deposit from the suspension liquid 306 over the SOI 303 surface when the wafer is dried. See also reference numeral 205 of FIG. 2. The drying can be done by evaporation (e.g., using a hot plate) or by high speed spinning of the wafer. Due to the selective wetting, only those surfaces surrounded by a wetting layer will have fine particles coverage 309.

Another method for forming the wetting boundary is illustrated in FIGS. 4A-4D. This method is different from the method illustrated in FIGS. 3A-3D by two aspects. First, it does not require a SOI substrate, but uses instead a conventional bulk silicon substrate. Second, the method does not lead to topography, so the wafer surface remains planar.

Figure 4A:
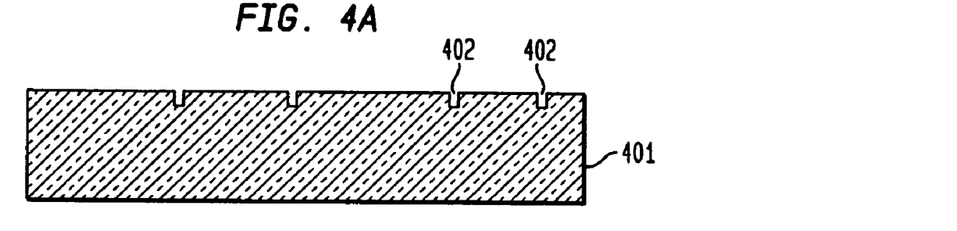
FIGS. 4A-4D are pictorial representations (through cross sectional views) illustrating the basic processing steps used in the present invention when the wetting boundary is an oxide filled trench that bounds a silicon region.

Referring to FIG. 4A, trenches 402 are etched into a silicon substrate 401. The trenches 402 surround silicon regions where coverage of fine particles is desired. The trenches 402 are formed by conventional lithography and etching such as RIE. The trench depth or width is not critical and is typically dictated by the available lithography resolution.

Figure 4B:
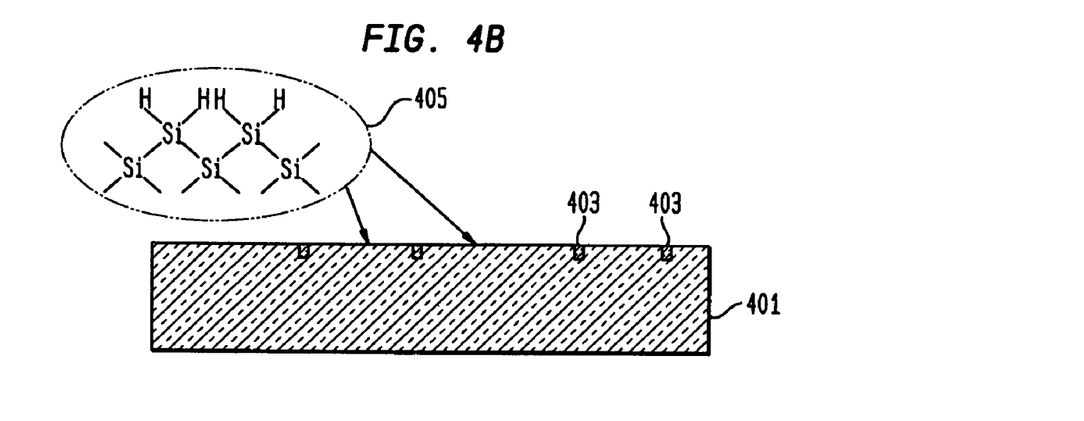

Referring to FIG. 4B, the trenches 402 are filled with silicon dioxide ($SiO_2$) 403. The process of filling the trenches typically includes blanket depositing a layer of $SiO_2$, and applying chemical mechanical polishing (CMP) to remove the $SiO_2$ over the top surface of the silicon substrate 401. After the CMP step, the only oxide remaining is that filling the trench 402. The oxide filled trench provides a wetting boundary for the silicon surface it surrounds. The substrate is then dipped in DHF to render the silicon surface hydrophobic 405.

The process of filling the trenches can also be achieved without the use of CMP. If the blanket deposited layer of $SiO_2$ is made thick enough such that the film thickness is larger than half of the trench width, then the trench will be oxide filled with most of the topography washed out. Next, RIE is applied to etch an amount of $SiO_2$ equal to the film thickness deposited over planer surfaces. As a result, the oxide over planar surfaces is removed while a plug of un-etched oxide remains in each trench.

Figure 4C:
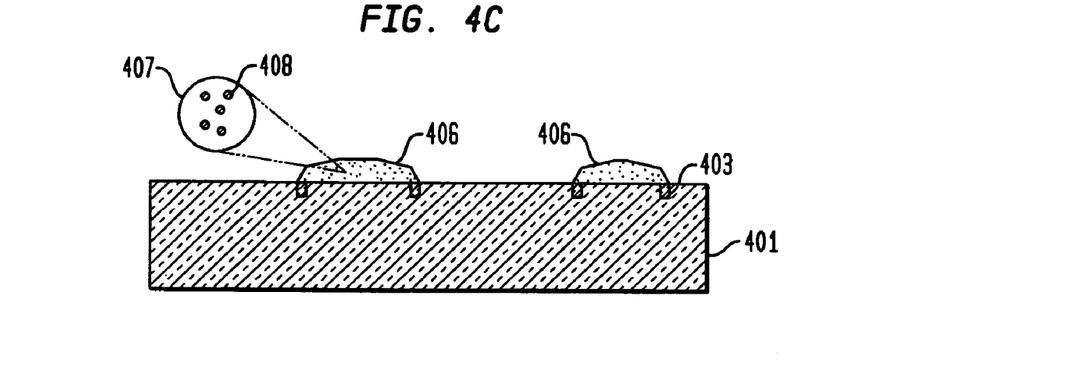
Figure 4D:
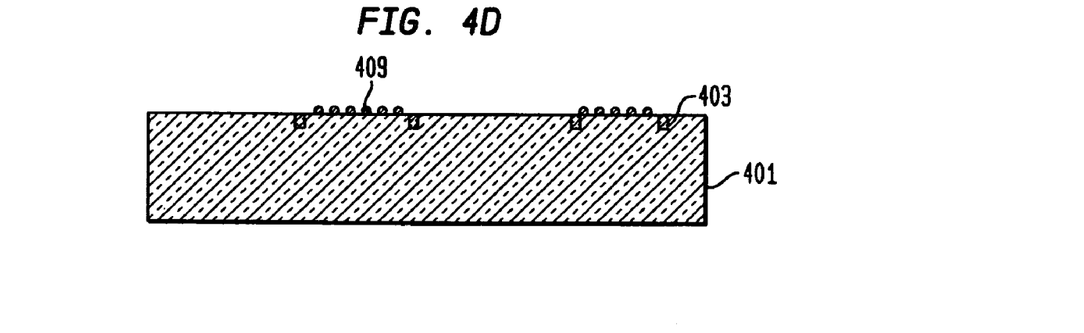

The rest of the steps described by FIGS. 4C and 4D are similar to those discussed for FIGS. 3C and 3D. It is observed that in FIGS. 4C-4D reference numeral 407 denotes the aqueous solution, reference numeral 408 denotes the suspended catalyst particles, reference numeral 406 represents the suspended liquid, and reference numeral 409 denotes the deposited particles.

Yet another method for forming the wetting boundary is illustrated in FIGS. 5A-5D. This method of the present invention uses a conventional silicon substrate and does not require a SOI substrate as the method illustrated in FIGS. 3A-3D. The wetting boundary is obtained by forming an oxide sidewall over the silicon mesa sidewall.

Figure 5A:
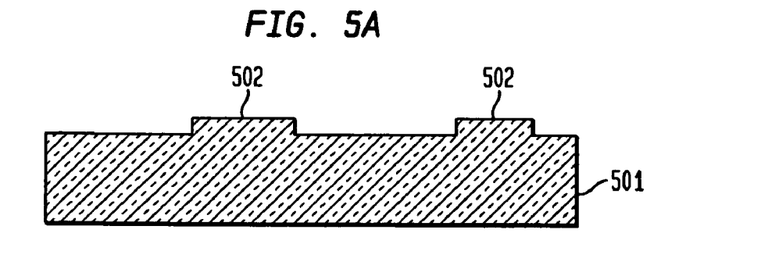
FIGS. 5A-5D are pictorial representations (through cross sectional views) illustrating the basic processing steps used in the present invention when the wetting boundary is an oxide spacer surrounding a silicon mesa.

Referring to FIG. 5A, the substrate 501 is patterned so that mesas 502 are formed. The top surface of each mesa 502 corresponds to those regions where coverage of fine particles is desired. The patterning can be done by conventional lithography and RIE. The height of the mesa 502 is not critical and is chosen such that it would allow an easy fabrication of a sidewall.

Figure 5B:
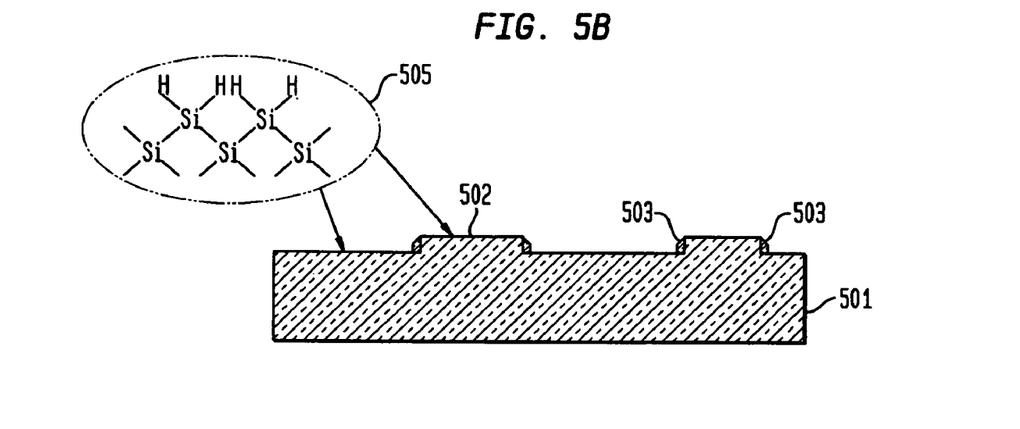

Referring to FIG. 5B, oxide sidewalls 503 are formed over the mesa 502 sidewalls. The fabrication of the sidewalls includes depositing a blanket oxide film followed by a blanket directional etching, such as RIE, to remove the oxide from all planar surfaces while leaving a sidewall on non-planar surfaces. The substrate 501 is then dipped in DHF to render the silicon surface hydrophobic 505. It is observed that the oxide sidewall should be thick enough to withstand the DHF dip. For example, the etch rate of thermal oxide is about 2 nm/min in 100:1 DHF at room temperature, is about 14 nm/min for low temperature LPCVD deposited oxide (LTO) and about 8 nm/min for 900° C. annealed LTO. Assuming a 60 s 100:1 DHF dip is used to remove the native oxide, then the deposited oxide film used for forming the oxide sidewall should be at least 2 nm thick, if a thermal oxide was used, and at least 8 nm thick, if an annealed LTO was used.

Figure 5C:
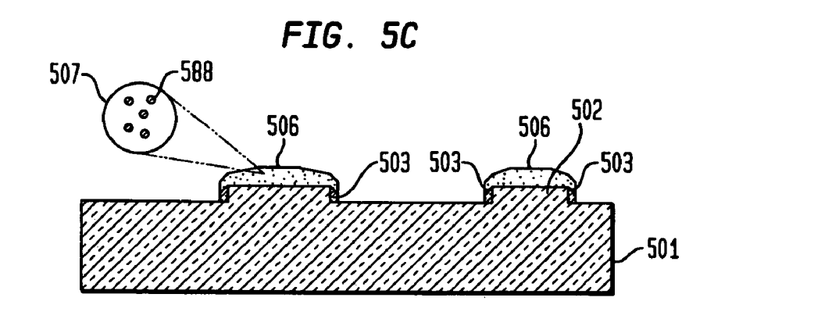
Figure 5D:
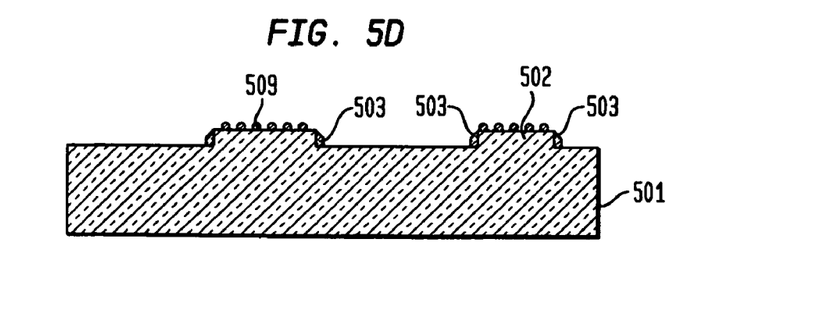

The rest of the steps illustrated by FIGS. 5C and 5D are similar to those discussed for FIGS. 3C and 3D or for FIGS. 4C and 4D. It is observed that in FIGS. 5C-5D reference numeral 507 denotes the aqueous solution, reference numeral 508 denotes the suspended catalyst particles, reference numeral 506 represents the suspended liquid, and reference numeral 509 denotes the deposited particles.

Figure 6A:
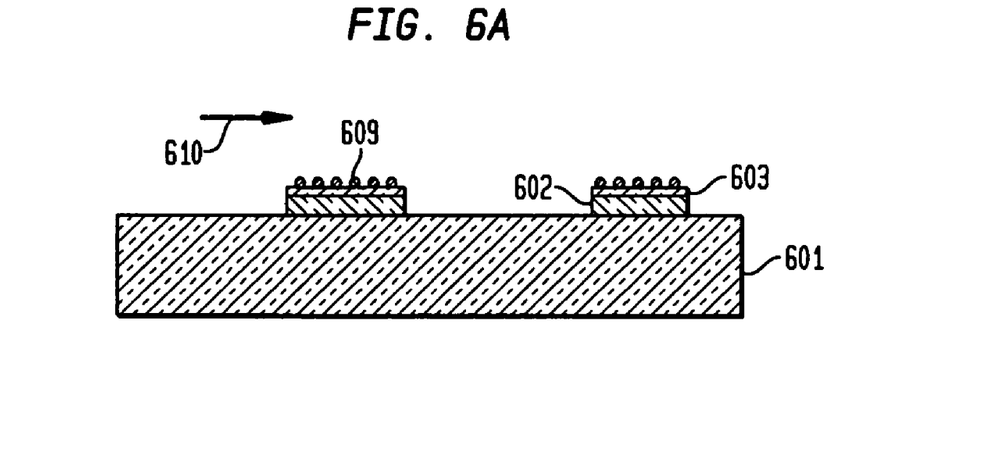
FIGS. 6A-6B are pictorial representations (through cross sectional views) illustrating the additional processing steps applied to fabricate silicon nanowires from catalyst particles deposited by the inventive technique.
Figure 6B:
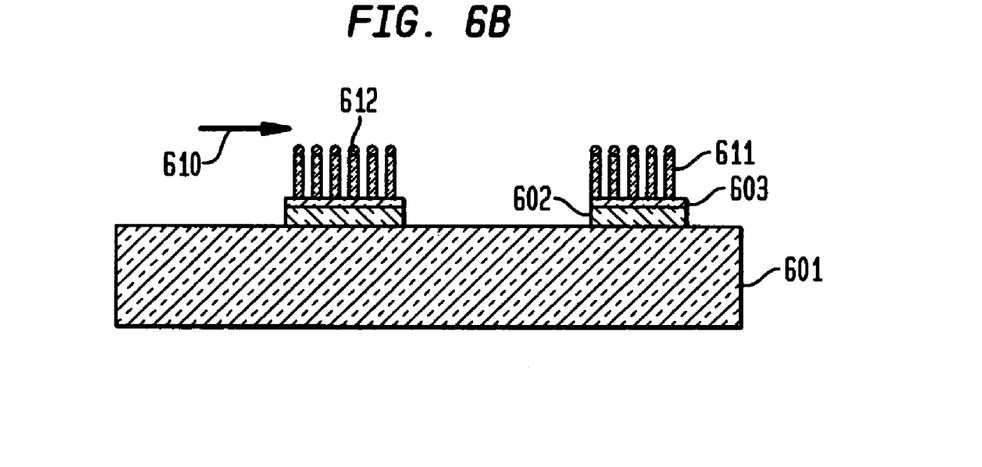

Referring to FIGS. 6A and 6B, the wafer is further processed to grow nanowires from selectively deposited catalyst particles. In these drawings, reference numeral 601 is the Si substrate, reference numeral 602 is the buried oxide, and reference numeral 603 is a SOI layer. For nanowire growth, the particles are typically deposited on a Si (111) surface. It is observed that the deposition technique outlined earlier is applicable to any orientation of the silicon surface. Yet, for nanowires growth, the (111) orientation was shown to provide good control over the grown nanowire crystal orientation. A key issue is that the catalyst particle has to be in contact with a clean silicon surface to allow the nanowire to mimic the silicon orientation. This requirement is met since the particles are deposited over a hydrogen terminated silicon surface (305, 405 or 505).

Following the particle deposition, the wafer is introduced into a growth chamber where an optional pre-growth clean is performed. For example, some of the gold colloids have an organic surfactant coating the gold particles. The surfactant prevents the gold particles to coalesce. Typically surfactants that can be employed in the present invention include, but are not limited to: ion citrates. The surfactant is removed prior to the growth by methods such as, for example, oxygen plasma or annealing in hydrogen at an elevated temperature (e.g., 500-800° C.). Following the cleaning, the sample is heated to the growth temperature (or cooled down to the growth temperature if hydrogen cleaning was used).

Referring to FIGS. 6A and 6B, nanowires 611 are grown perpendicular to the substrate surface. The growth of the nanowires 611 is assisted by the catalyst 609 and is typically carried out by chemical vapor deposition (CVD) or plasma enhanced chemical vapor deposition (PECVD). The growth temperature depends on the precursor 610 used. For example, for silane ($SiH_4$) a typical growth temperature is 370° C. to 500° C. For silicon tetrachloride ($SiCl_4$), the growth temperature is 800° C.-950° C. By adding chlorine to $SiH_4$, the growth temperature can be raised to above 600° C. The growth rate of the nanowires 611 depends on the growth temperature and the gas pressure in the growth chamber. For example, a typical CVD growth rate for $SiH_4$ diluted with $H_2$ (1:1) at a pressure of 1 torr and a growth temperature of 450° C. is about 7.6 μm/hour. The anisotropic growth of the nanowires is believed to be best described by the vapor-liquid-solid (VLS) mechanism. When the growth is initiated a catalyst-silicon liquid alloy 612 is formed. With additional supply of Si from the gas phase (e.g., $SiH_4$ 610), the catalyst-silicon droplet becomes supersaturated with Si and the excess silicon is deposited at the solid-liquid interface. As a result, the liquid droplet 612 rises from the original substrate surface to the tip of a growing nanowire crystal 611. If the growth temperature is kept below about 500° C. (if $SiH_4$ is used), or alternatively a chlorine additive is used, no deposition of silicon take place on the other surfaces.

Figure 7:
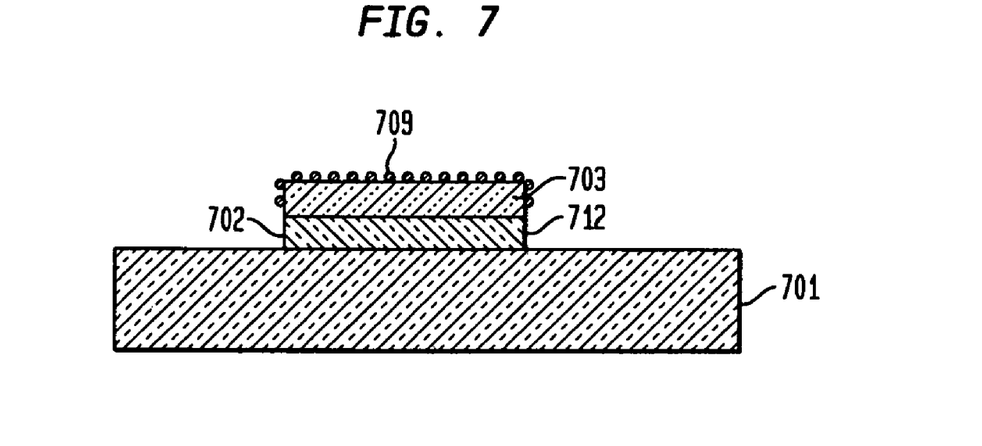
FIG. 7 is a pictorial representation (through cross sectional view) illustrating the additional selectivity obtained when charged particles are used.

FIG. 7 illustrates an additional level of selectivity in the deposition of fine particle that is obtained with charged particles. In this drawing, reference numeral 701 is the Si substrate, reference numeral 702 is the buried oxide, and reference numeral 703 is a SOI layer. When the aqueous suspension consists of negatively charged particle (for example, as a method of keeping the fine particles from agglomerating) the particles will not deposit on the $SiO_2$ surface 712. The negatively charged particles do not deposit on the buried oxide 702 sidewall due to negative charge on the oxide surface (due to the release of $H^+$ when reacting with water of pH=7). As a result, the particles contained in the suspension will only deposit on the SOI 703 surfaces. This selectivity in deposition is additional to selectivity obtained by the wetting properties of the surface (i.e., no deposition takes place on the Si substrate 701 surface due to the surface being hydrophobic).

One method to fabricate charged gold particles was introduced by G. Frens in Nature (London) 241, p. 20 (1973). The gold nanoparticles are produced in deionized water by reduction of hydrogen tetrachloroaurate ($HAuCl_4$) with $Na_3$-citrate. The sodium citrate first acts as a reducing agent, and later the negative citrate ions are adsorbed onto the gold nanoparticles and introduce the surface charge that repels the particles and prevents them from agglomerating.

It is observed that the detailed discussion provided above relates to Si or SOI substrates. Although Si substrates are specifically described and illustrated, the present invention can be extended to non Si-containing substrates or SiGe-on-insulator substrates provided that these other substrates can be defined to include regions with a wetting boundary and provided that the other substrates can be made to have a hydrophobic surface.

The following example illustrates the basic method of the present invention in making fine Au particles deposited on SOI islands using one of the techniques of the present invention.

EXAMPLE

Figure 8A:
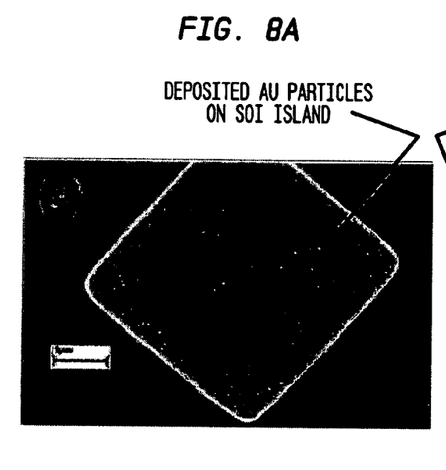
FIGS. 8A-8D are top-down scanning electron microscope (SEM) images of fine gold particles deposited on SOI islands by the technique outlined in FIGS. 3A-3D.
Figure 8B:
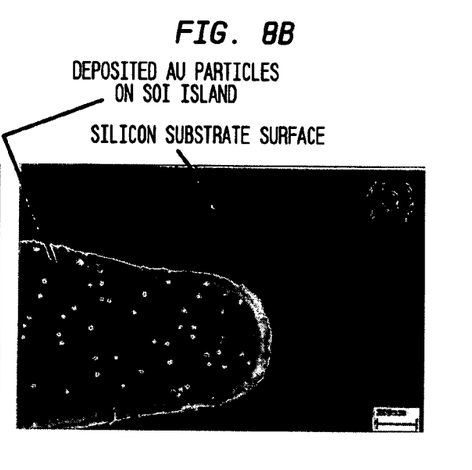
Figures 8C, 8D:
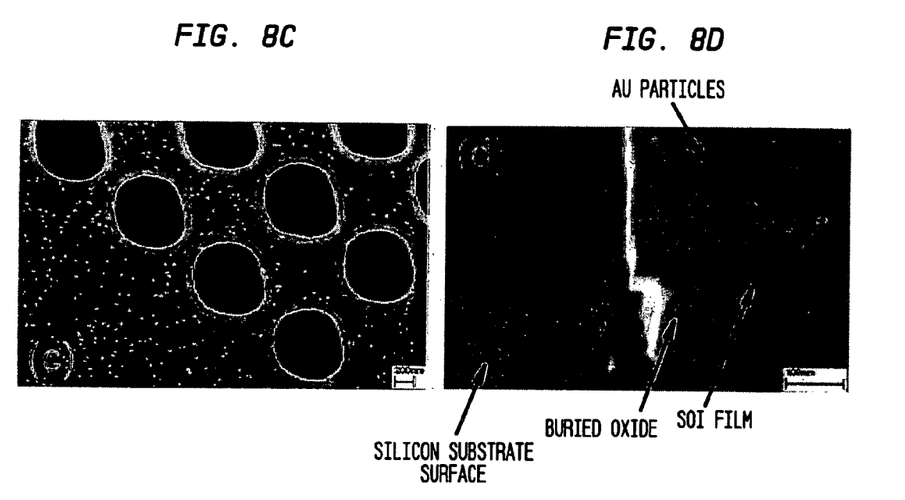

FIGS. 8A to 8C shows top-down SEM images of fine gold particles deposited on SOI islands by using the technique outlined in FIGS. 3A-3D. The gold particles were deposited from a gold colloid consisting of 20 nm particles suspended in an aqueous solution. The SOI substrate was comprised of a 55 nm thick SOI film over a 145 nm thick buried oxide. The SOI film and buried oxide were patterned into isolated SOI islands using conventional lithography and RIE. The wafer was dipped in 10:1 DHF for 30 s to render the surface hydrophobic and the gold colloid was dispensed on the wafer surface. The excess liquid was typically removed by spinning the wafer at a speed of 500 rpm for 200 s.

As can be seen in FIGS. 8A to 8C, the gold particles were deposited only over the SOI island, with no deposition over the silicon substrate. The density of the gold particles depended on their density in the suspension and on the spinning speed of the wafer.

FIG. 8D shows a side view SEM image of negatively charged gold particles deposited on SOI islands by the technique outlined in FIGS. 3A-3D and FIG. 7. As can be seen, there is no deposition of gold particles on the buried oxide sidewalls or on the substrate surface. The deposition of the gold particles was limited to the SOI film surface.

While the present invention has been has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method of depositing fine particles on selected regions of a substrate comprising:
    providing a semiconductor substrate having selected regions of a surface of said semiconductor substrate bounded by a wetting boundary, wherein said semiconductor substrate includes a silicon-on-insulator (SOI) film formed over a buried oxide and wherein said wetting boundary is formed by providing a mesa formed by etching through said SOI film and said buried oxide;
    rendering said surface of said semiconductor substrate hydrophobic; and
    dispensing a suspension containing fine particles on said semiconductor substrate, wherein said suspension wets only said selected regions that are bounded by said wetting boundary.

2. The method of claim 1 further comprises depositing fine particles onto said selected regions from said suspension.

3. The method of claim 2 further comprises growing semiconductor nanowires from said deposited fine particles.

4. The method of claim 1 further comprising spinning said semiconductor substrate to remove excess suspension.

5. The method of claim 1 wherein said fine particles are electrically charged and deposit only on said bounded regions.

6. The method of claim 1 wherein said fine particles are metal particles.

7. The method of claim 6 wherein said metal particles comprise Au, Ag, Pt, Fe, Co, Pd, or iron-oxide.

8. The method of claim 1 wherein said fine particles are Au particles.

9. The method of claim 1 wherein said wetting boundary comprises a negatively charged surface, and wherein said fine particles are negatively charged to obtain additional selectivity such that said fine particles deposit only on an inner surface bounded by the wetting boundary.

* * * * *